United States Patent
Co et al.

(10) Patent No.: US 7,277,337 B1
(45) Date of Patent: Oct. 2, 2007

(54) MEMORY MODULE WITH A DEFECTIVE MEMORY CHIP HAVING DEFECTIVE BLOCKS DISABLED BY NON-MULTIPLEXED ADDRESS LINES TO THE DEFECTIVE CHIP

(75) Inventors: Ramon S. Co, Trabuco Canyon, CA (US); Mike Chen, Newport Coast, CA (US); David Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 0 days.

(21) Appl. No.: 11/309,782

(22) Filed: Sep. 25, 2006

(51) Int. Cl.
*G11C 29/00* (2006.01)
(52) U.S. Cl. ..................... 365/200; 365/201
(58) Field of Classification Search ........... 365/185.09; 714/7
See application file for complete search history.

(56) References Cited

U.S. PATENT DOCUMENTS

| | | | |
|---|---|---|---|
| 4,992,984 A | 2/1991 | Busch et al. ............... 365/200 |
| 5,668,763 A * | 9/1997 | Fujioka et al. ............. 365/200 |
| 5,691,945 A * | 11/1997 | Liou et al. ................ 365/200 |
| 5,758,056 A | 5/1998 | Barr .............................. 714/7 |
| 5,841,957 A | 11/1998 | Ju et al. ....................... 714/8 |
| 5,996,096 A | 11/1999 | Dell et al. ................... 714/710 |
| 6,052,798 A | 4/2000 | Jeddeloh .......................... 714/8 |
| 6,112,285 A | 8/2000 | Ganapathy et al. ......... 711/207 |
| 6,119,049 A | 9/2000 | Peddle ......................... 700/121 |
| 6,212,648 B1 | 1/2001 | Abe ............................... 714/8 |
| 6,636,447 B2 | 10/2003 | Beer ........................... 365/200 |
| 6,754,117 B2 | 6/2004 | Jeddeloh ..................... 365/201 |
| 2004/0088614 A1 | 5/2004 | Wu ............................. 714/718 |
| 2006/0023482 A1 | 2/2006 | Dreps et al. ................... 365/63 |
| 2006/0036827 A1 | 2/2006 | Dell et al. ................... 711/167 |
| 2006/0039210 A1 | 2/2006 | Blodgett ..................... 365/200 |

* cited by examiner

*Primary Examiner*—Tan T. Nguyen
(74) *Attorney, Agent, or Firm*—Stuart T. Auvinen; gPatent LLC (57) ABSTRACT

A downgraded memory module has downgraded DRAM chips soldered to its substrate. The downgraded DRAM chips have a defective memory cell in a logical quadrant of the memory. A physical MSB is a row address present on a non-downgraded DRAM of size S but not used on a downgraded DRAM size S/2. The physical MSB and a second address pin are non-multiplexed address pins that do not carry column addresses. The physical MSB and the second address pin logically divided the DRAM into quadrants. Two good quadrants without defects are selected, and jumpers on the memory module drive the physical MSB and the second address pin with signals that select only these two quadrants and disable access to quadrants containing defects. DRAM chips can be marked or sorted into bins for combinations of good quadrants. Downgraded memory modules have all DRAM chips from the same bin that share jumper settings.

23 Claims, 8 Drawing Sheets

FRONT SIDE

PRIOR ART

MEMORY MODULE WITH A DEFECTIVE MEMORY CHIP HAVING DEFECTIVE BLOCKS DISABLED BY NON-MULTIPLEXED ADDRESS LINES TO THE DEFECTIVE CHIP

FIELD OF THE INVENTION

This invention relates to memory-module manufacturing, and more particularly to testing and using downgraded memory chips.

BACKGROUND OF THE INVENTION

Memory modules are widely used in a variety of electronic systems, especially Personal Computers (PC's). Memory modules are built to meet specifications set by industry standards, thus ensuring a wide potential market. High-volume production and competition have driven module costs down dramatically, benefiting the PC buyer.

Memory modules are made in many different sizes and capacities, such as older 30-pin and 72-pin single-inline memory modules (SIMMs) and newer 168-pin, 184-pin, and 240-pin dual inline memory modules (DIMMs). The "pins" were originally pins extending from the module's edge, but now most modules are leadless, having metal contact pads or leads. The modules are small in size, being about 3-5 inches long and about an inch to an inch and a half in height.

The modules contain a small printed-circuit board substrate, typically a multi-layer board with alternating laminated layers of fiberglass insulation and foil or metal interconnect layers. Surface mounted components such as DRAM chips and capacitors are soldered onto one or both surfaces of the substrate.

Figure 1:
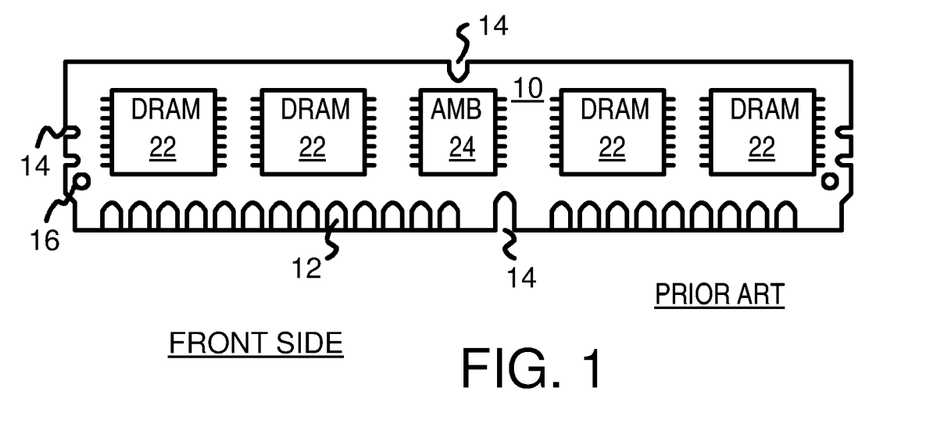
FIG. 1 shows a fully-buffered memory module.

FIG. 1 shows a fully-buffered memory module. Memory module 10 contains a substrate such as a multi-layer printed-circuit board (PCB) with surface-mounted DRAM chips 22 mounted to the front surface or side of the substrate, as shown in FIG. 1, while more DRAM chips 22 are mounted to the back side or surface of the substrate (not shown). Memory module 10 is a fully-buffered dual-inline memory module (FB-DIMM) that is fully buffered by Advanced Memory Buffer (AMB) 24 on memory module 10.

Metal contact pads 12 are positioned along the bottom edge of the module on both front and back surfaces. Metal contact pads 12 mate with pads on a module socket to electrically connect the module to a PC's motherboard. Holes 16 are present on some kinds of modules to ensure that the module is correctly positioned in the socket. Notches 14 also ensure correct insertion of the module. Capacitors or other discrete components are surface-mounted on the substrate to filter noise from the DRAM chips 22.

As system clock speeds increase, data must be transmitted and received at ever-increasing rates. Differential signaling techniques are being used to carry data, clock, and commands to and from memory modules. AMB 24 is a chip mounted onto the substrate of memory module 10 to support differential signaling through metal contact pads 12. AMB 24 sends and receives external packets or frames of data and commands to other memory modules in other sockets over differential data lines in metal contact pads 12.

AMB 24 also extracts data from the external frames and writes the extracted data to DRAM chips 22 on memory module 10. Command frames to read data are decoded by AMB 24. AMB 24 sends addresses and read signals to DRAM chips 22 to read the requested data, and packages the data into external frames that are transmitted from AMB 24 over metal contact pads 12 to other memory modules and eventually to the host processor.

Memory module 10 is known as a fully-buffered memory module since AMB 24 buffers data from DRAM chips 22 to metal contact pads 12. DRAM chips 22 do not send and receive data directly from metal contact pads 12 as in many prior memory module standards. Since DRAM chips 22 do not directly communicate data with metal contact pads 12, signals on metal contact pads 12 can operate at very high data rates.

Memory modules without AMB 24 are still being made. Such unbuffered memory modules carry address, data, and control signals across metal contact pads 12 from the motherboard directly to DRAM chips 22. Some memory modules use simple buffers that buffer or latch some of these signals but do not use the more complex serial-packet interface of a FB-DIMM.

DRAM chips may have a very large capacity, such as 512 Mbits, or half a giga-bit. The large number of memory cells, small size of individual memory cells, and overall large area of the DRAM die cause manufacturing defects to be somewhat common. DRAM chips are tested on a wafer before being separated and packaged, but this wafer-sort test may not catch all defects. A probe card is used to make contact with individual die on the wafer, causing a very noisy test environment. Thus test speeds are limited at wafer sort, preventing more exhaustive testing that could catch more defects.

Thus some packaged DRAM chips are going to contain defects. Further testing of packaged DRAM chips may be performed cost-effectively at higher speeds, allowing defective DRAM chips to be identified and discarded. However, discarding packaged DRAM chips is somewhat wasteful, since often only a single defect is present. For example, a defect may cause only 1 of the half-billion memory cells to fail. Nearly half a billion memory cells operate properly on a DRAM chip having a single defect, yet this chip is typically discarded.

Some DRAM chips are repairable. A fuse on the die may be blown using a laser during wafer sort, or some other method may be used. This repair may be attempted and performed to determine which DRAM chips are good and which are bad, or repair may be a separate step. Repair often causes the full size of memory to be available when repair is successful. For example, repairing a bad memory cell on a 512 Mbit DRAM allows a full 512 Mbits to be usable, since the bad memory cell is replaced by a redundant memory cell during repair.

Rather than repairing chips, some chip manufacturers may downgrade DRAM chips to lower capacities. For example, a 1 giga-bit DRAM die with a defect may be downgraded, packaged, and sold as a half giga-bit DRAM.

Manufacturers of memory modules may purchase packaged DRAMs that have a variety of levels of testing already performed. Cost may be reduced by purchasing packaged DRAMs that have not yet been exhaustively tested. The memory module manufacturer may arrange to more fully test these incoming DRAM chips to weed out DRAM chips with single defects.

What is desired is memory module that can be constructed with downgraded DRAM chips. A memory module that can accept downgraded memory chips to produce a reduced-capacity memory module is desirable. A process to test partially-tested DRAM chips, downgrade faulty chips, and use the downgraded chips on memory modules is desirable.

DETAILED DESCRIPTION

The present invention relates to an improvement in memory module manufacturing. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 2A:
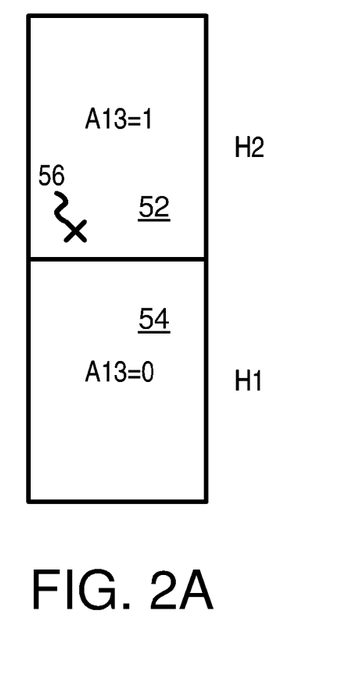
FIGS. 2A-B show a defect on a downgradable DRAM chip.

FIGS. 2A-B show a defect on a downgradable DRAM chip. In FIG. 2A, DRAM chip has an upper address bit A13 that divides the memory into two halves H1, H2. The halves H1, H2 may be logical halves rather than separate physical arrays on the DRAM die. When address A13=1, half H2 is selected, while when A13=0, half H1 is selected. Defect 56 occurs when A13 is 1, so defect 56 is in H2 half 52. Since all bits with A13=0 are good, H1 half 54 is a good half and could be usable on a memory module.

Figure 2B:
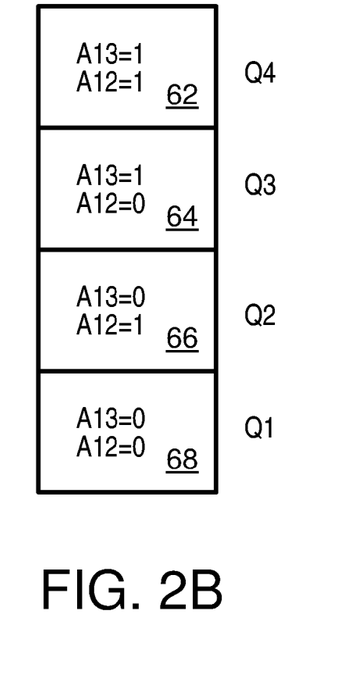

Sometimes two or more defects may occur. When defects occur in both halves 52, 54, there is no half that is usable. However, the DRAM chip can be further divided into quadrants. In FIG. 2B, upper address bits A13, A12 have four possible values, creating four quadrants 62, 64, 66, 68, also labeled Q4, Q3, Q2, Q1. For example, for memory cells addressable by A13=1 and A12=0, Q3 quadrant 64 is selected.

When defects occur in only two of the four quadrants, the remaining two quadrants may be combined to form a half-size DRAM. For example, when defects occur in Q3, Q2 quadrants 64, 66, the remaining Q4, Q1 quadrants 62, 68 may be used as a half-size memory.

Figure 3:
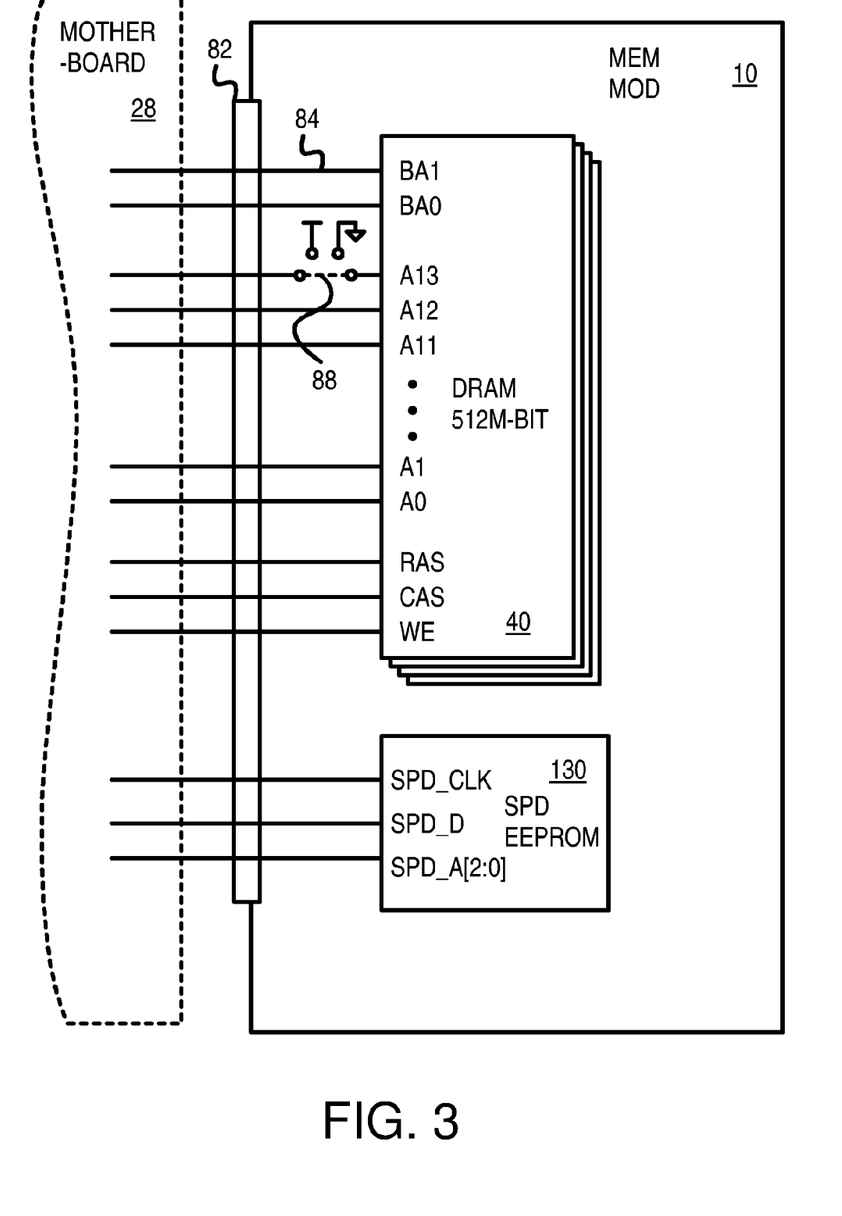
FIG. 3 shows a downgradable memory module that can accept a DRAM chip with a bad half.

FIG. 3 shows a downgradable memory module that can accept a DRAM chip with a bad half. Memory module 10 has connector 82 that mates with a memory module socket on motherboard 28. Memory module 10 is an unbuffered memory module with DRAM address signals A13:0, bank addresses BA1:0, and other control signals such as RAS, CAS, WE, and any clock or clock-enable signals passing directly through connector 82.

Most of these signals from connector 82 pass directly to DRAM chips 40 over traces 84 on the substrate of memory module 10. However, an upper address signal A13 passes through jumper 88 before being applied to the A13 input of one or more of DRAM chips 40. Jumper 88 can connect the input A13 from connector 82 to DRAM chips 40 when DRAM chips 40 are not faulty and have the full memory size.

However, when one of DRAM chips 40 has a bad half, jumper 88 connects the A13 input of the bad DRAM chip 40 to either power or ground. When the defect is in upper half H2 (FIG. 2A), then jumper 88 is connected to ground, forcing A13 to 0. Thus only lower half H1 can be accessed. Access to upper half H2 is blocked by jumper 88. Only lower half H1 of DRAM chips 40 can be accessed.

When the defect is in lower half H1 (FIG. 2A), then jumper 88 is connected to power, forcing A13 to 1. Thus only upper half H2 can be accessed. Access to lower half H1 is blocked by jumper 88. Only upper half H2 of DRAM chips 40 can be accessed.

Both row and column addresses are input through multiplexed address lines. The row address is applied to the address lines, then RAS is driven low and DRAM chips 40 latch in the row address and begin accessing all columns in the row. Then the column address is applied to the same address lines, and CAS is driven low. DRAM chips 40 use the column address to select one of the columns of data in the selected row.

A few bank address inputs such as BA1:0 may also be supported. Bank addresses are not multiplexed and are usually applied with the row address. Bank addresses might select one of several memory arrays within the DRAM chip.

However, modern DRAMs typically have more row address bits than column address bits. For example, a 512 Mbit DRAM chip arranged as 64M×8 may have 14 row address bits that are applied on bank address inputs BA1:0 and all of address inputs A13:0, for a total of 16 row address bits. Only 10 column address bits are needed, which are input on address lines A9:0. The remaining address inputs A13:10 are don't cares, and any value may be applied when the column address is being strobed in with CAS. The total number of address bits is 16+10, or 26, which can address $2^{26}$ or 64M locations.

Other sizes of memory chips have different address assignments. A 512 Mbit chip arranged as 128M×4 has only 4 data bits but twice as many locations, and has one extra column bit that is applied to A11. A 512 Mbit chip arranged as 32M×16 has 16 data bits and half as many locations, and has one less row bit (A12:0 are row address inputs and A9:0 are column address inputs).

For other memory sizes, the highest address bit that is not a bank address may be used, such as A12 for a 256 Mbit DRAM chip. For example, a 256 Mbit chip arranged as 32M×8 may have 13 row address bits that are applied on all of address inputs A12:0 and bank address inputs BA1:0, for a total of 15 row address bits. Only 10 column bits are needed, which are input on address lines A9:0. When arranged as 64M×4, it has twice as many locations and has one extra column bit that is applied to A11. When arranged as 16M×16, it has half as many locations and has one less column bit A9 (A8:0 are column address inputs).

Some memory modules include a serial-presence-detect electrically-erasable programmable read-only memory (SPD-EEPROM) on the memory module substrate. SPD-EEPROM 130 stores configuration information for the memory module, such as speed, depth, and arrangement of the memory on the memory module.

During initialization, the host processor on motherboard 28 reads the configuration from SPD-EEPROM 130. The configuration information about memory module 10 is sent over serial data line SPD_D synchronized to SPD clock SPD_CLK. Address inputs to SPD EEPROM 130 are carried from motherboard 28 on address lines SPD_A[2:0], which may be hard wired on motherboard 28. The wiring configuration of SPD_A[2:0] on motherboard 28 determines the device address (memory-module slot number) of memory module 10. Data sent over serial data line SPD-D is a series of frames consisting of device address, device type, register location, and register data.

Figure 4:
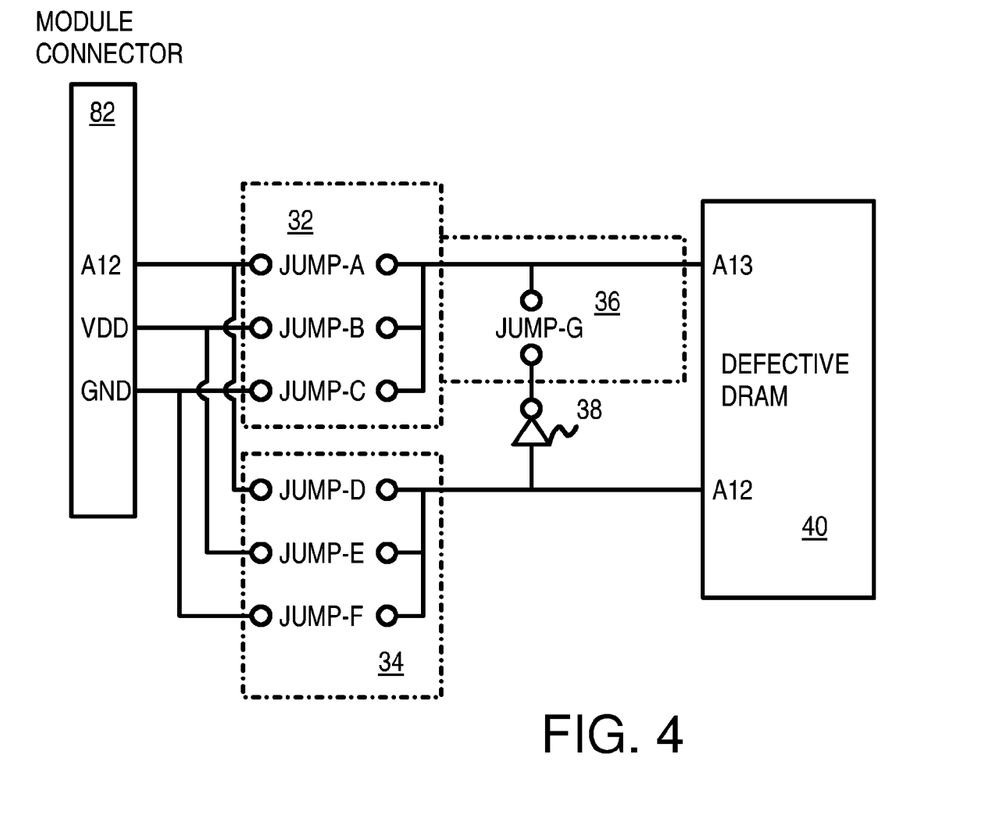
FIG. 4 shows jumpers on a downgradable memory module for use with downgraded DRAM chips.

FIG. 4 shows jumpers on a downgradable memory module for use with downgraded DRAM chips. While a single jumper 88 (FIG. 3) may be used when either half H1 or half H2 contain no defects, more complex jumpers are used when both halves contain defects, but two quadrants are free from defects.

Jumpers 32, 34, 36 and inverter 38 are formed or soldered to the substrate of the memory module. Upper address signals A12, A13 from connector 82 are intercepted by jumpers. If the module substrate is to be used for both good and downgraded DRAM chips, then another jumper 88 (FIG. 3) could be added between A13 on connector 82 and the A13 input to defective DRAM chip 40. Otherwise, this A13 connection is broken. Power and ground connect to all DRAM chips by power and ground traces (not shown), and other address, data, and control signals are also connected from connector 82 to DRAM chips 40 by traces (not shown).

Jumpers 32, 34, 36 could be present on a standard memory module substrate that is used for many kinds of memory modules, both with good DRAM and with downgraded DRAM chips. When only good DRAM chips are present, jumper 88 (FIG. 3) is bridged (closed) to connect A13, while jumper D in jumpers 34 is bridged to connect A12. All other jumpers are open. When downgraded DRAM chips are used, jumper 88 is open.

Jumpers A, B, C are part of jumper 32, which can drive A12, power, or ground to the A13 input of DRAM chip 40. Jumpers D, E, F are part of jumper 34, which can drive A12, power, or ground to the A12 input of DRAM chip 40. Jumper G is part of jumper 36, which drives the inverted A12 input generated by inverter 38 to the A13 input of DRAM chip 40.

Jumpers 32, 34, 36 allow for various combinations of quadrants to be activated while disabling other quadrants. Downgraded operation of DRAM chips is possible, as described below and shown in Table 1.

When lower half H1 is good, quadrants Q1, Q2 are good. Jumper C connects A13 to ground, and jumper D connects A12 from connector 82 to DRAM chips 40. All other jumpers are open. When upper half H2 is good, quadrants Q3 Q4 are good, jumper B connects A13 to power, and jumper D connects A12 from connector 82 to DRAM chips 40. All other jumpers are open.

When both halves H1, H2 have a defect, downgrading is still possible. If any two of the four quadrants (FIG. 2B) are defect-free, then a half-size memory is still possible. There are 6 possible combinations of two quadrants, as shown in the rows of Table 1. The first two combinations (Q1Q2 and Q3Q4) correspond to halves H1 and H2, shown at the top of Table 1.

TABLE 1

| | Jumper Settings for Good Quadrants | |
|---|---|---|
| Good Quadrants | (A13, A12), (A13, A12) for the 2 Quadrants | Jumpers Bridged (Closed) |
| Q1 Q2 (H1) | (A13 = 0, A12 = 0), (A13 = 0, A12 = 1) | C, D |
| Q3 Q4 (H2) | (A13 = 1, A12 = 0), (A13 = 1, A12 = 1) | B, D |
| Q1 Q3 | (A13 = 0, A12 = 0), (A13 = 1, A12 = 0) | A, F |
| Q2 Q4 | (A13 = 0, A12 = 1), (A13 = 1, A12 = 1) | A, E |
| Q1 Q4 | (A13 = 0, A12 = 0), (A13 = 1, A12 = 1) | A, D |
| Q2 Q3 | (A13 = 0, A12 = 1), (A13 = 1, A12 = 0) | D, G |

When quadrants Q1, Q3 are good, jumpers A, F are closed, while the other jumpers are open. A12 is grounded by jumper F, while the A12 input from connector 82 is applied to the A13 input to DRAM chip 40 through jumper A. This allows A13 to toggle between 0 and 1, while A12 is fixed at 0. Referring to FIG. 2B, quadrant Q1 has A13=0 and A12=0, while quadrant Q3 has A13=1 and A12=0. Grounding A12 and passing A12 up to A13 allows these quadrants to both be accessed for both values of input A12.

When quadrants Q2, Q4 are good, jumpers A, E are closed, while the other jumpers are open. A12 is tied high by jumper E, while the A12 input from connector 82 is applied to the A13 input to DRAM chip 40 through jumper A. The A13 input to DRAM chip 40 may toggle between 0 and 1, while A12 is fixed at 1. Referring to FIG. 2B, quadrant Q2 has A13=0 and A12=1, while quadrant Q4 has A13=1 and A2=1. Setting A12=1 and passing A12 up to A13 allows both of these quadrants to be accessed for both values of input A12.

When quadrants Q1, Q4 are good, jumpers A, D are closed, while the other jumpers are open. The A12 input from connector 82 is applied to the A13 input to DRAM chip 40 through jumper A. The A12 input from connector 82 is also applied to the A12 input to DRAM chip 40 through jumper D. Thus the A12 input drives both A12, A13 inputs to DRAM chip 40. Both A12, A13 inputs are forced to the same value. Referring to FIG. 2B, quadrant Q1 has A13=0 and A12=0, while quadrant Q4 has A13=1 and A12=1. Passing A12 to both A12, A13 inputs causes quadrant Q1 to be accessed when A12=0, and quadrant Q4 to be accessed when A12=1, since A13 mirrors the value of A12.

When quadrants Q2, Q3 are good, jumpers D, G are closed, while the other jumpers are open. The A12 input from connector 82 is applied to the A12 input to DRAM chip 40 through jumper D. Inverter 38 and jumper G invert the current value of A12 to generate the A13 input. Although A12 can toggle high and low, inputs A12, A13 always have opposite values in this configuration.

Referring to FIG. 2B, quadrant Q2 has A13=0 and A12=1, while quadrant Q3 has A13=1 and A12=0. A13 is always the opposite of A12. Inverter 38 drives input A13 to the inverse of input A12 when jumper G is closed. Inverter 38 thus allows quadrants Q2, Q3 to be accessed for both values of A12.

A tester can determine which quadrants are good, if any, for each failing DRAM chip. The DRAM chip can be marked or binned as a downgraded part when two quadrants pass. The particular quadrants that passed can be marked on the package of the downgraded DRAM chip, or the chips can be sorted into separate bins for the 6 possible combinations of good quadrants, and the separate bins of chips used with memory module substrates having different jumper configurations.

For example, all Q1Q3 sorted DRAM chips are soldered to a memory module substrate that has jumpers A and F closed, while Q2Q4 sorted DRAM chips are soldered to a memory module substrate that has jumpers A, E closed.

Figure 5A:
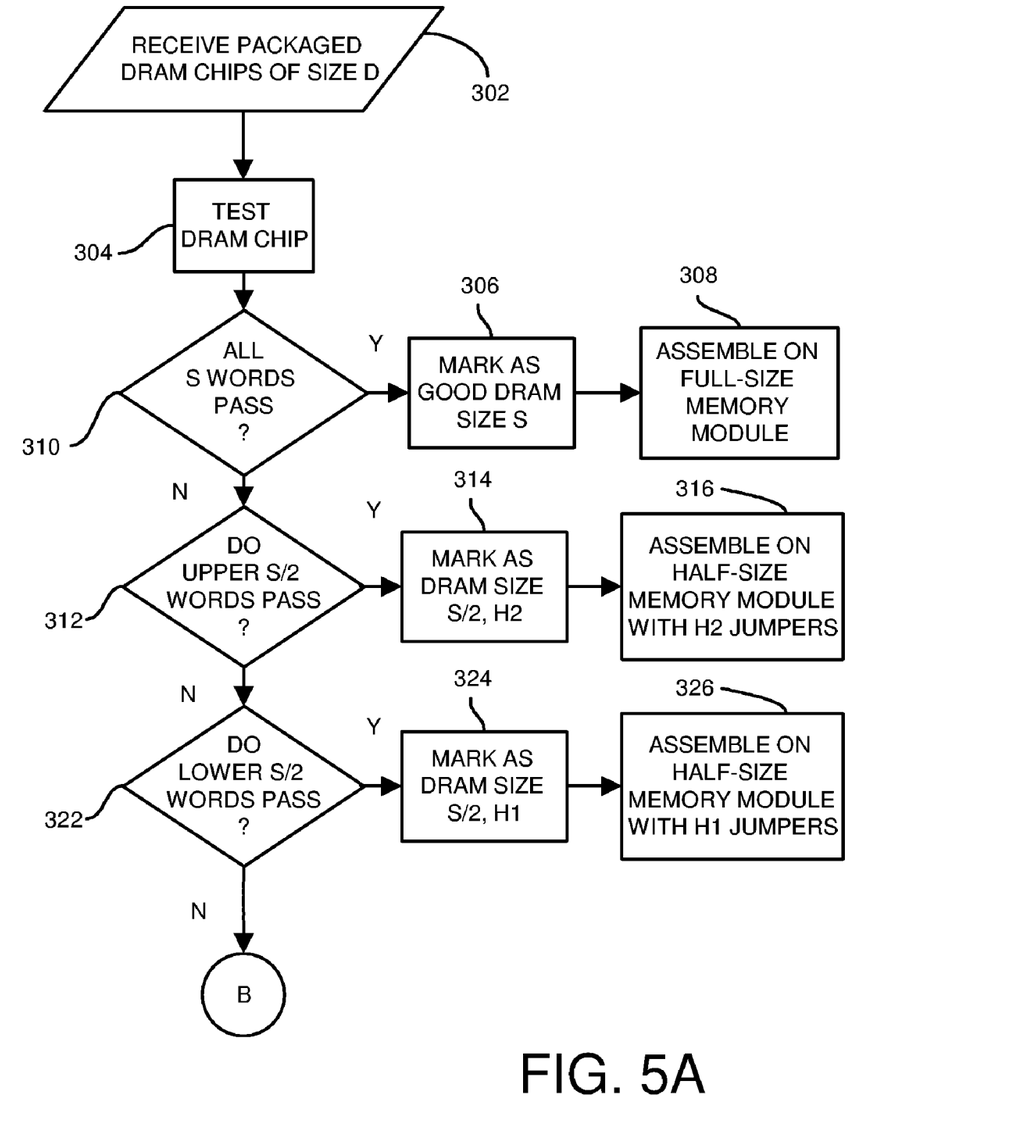
FIGS. 5A-B shows a flowchart of a manufacturing process that uses downgraded DRAM chips and jumpers for activating good quadrants or halves.
Figure 5B:
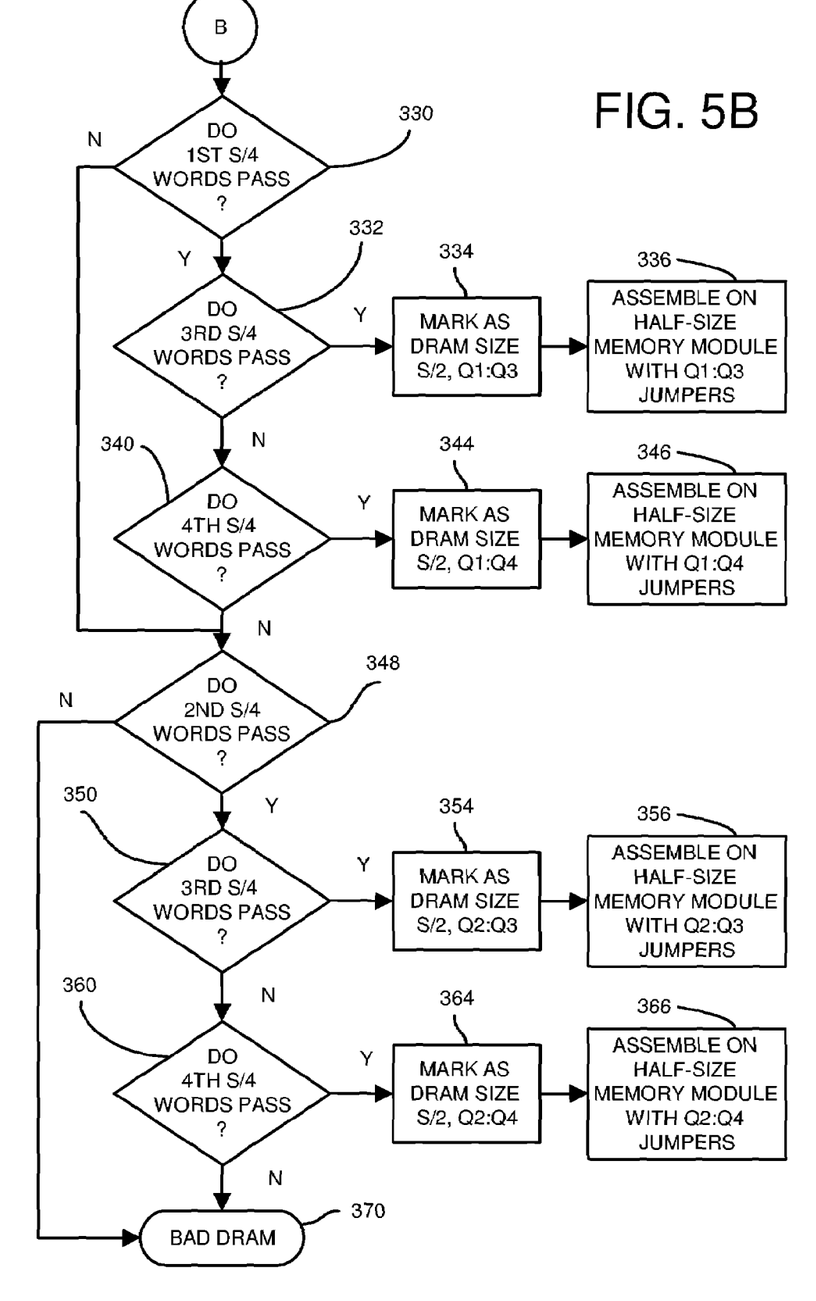

FIGS. 5A-B shows a flowchart of a manufacturing process that uses downgraded DRAM chips and jumpers for activating good quadrants or halves. Packaged DRAM chips are purchased and received from a manufacturer of DRAM chips, step 302. These DRAM chips have a size D, and can have various widths, such as x4, x8, x16, etc. Chips with different data widths are tested and processed separately, using different test programs and module substrates. For this flow, chips having a depth S are selected. There are S words in each DRAM chip that can be separately addressed by a total N address bits, where $S=2^N$ addressable locations.

The DRAM-chip manufacturer has performed some limited testing of the DRAM chips, but extensive testing has not yet occurred, perhaps allowing the memory module manufacturer to buy these DRAM chips at a lower price than if exhaustive testing had been ordered. The memory module manufacturer arranges for more exhaustive testing of the incoming DRAM chips, step 304. Most DRAM chips are fully functional and pass as good chips, step 310. These passing DRAM chips are marked as good DRAM of size S, step 306. These good DRAM chips are soldered to full-size memory module substrates during assembly, step 308. These full-size memory module substrates directly connect A13, A12 from the connector to the DRAM chip inputs.

When a defect prevents all S words from passing, step 310, then the upper and lower halves, and then the quadrants are checked to see if the DRAM chip can be used as a half-size downgraded chip.

When the upper S/2 words pass, step 312, then the upper half is defect free. The defect is isolated in the lower half. The DRAM chip is marked as size S/2, half H2 to indicate that the upper half H2 is good, step 314. This DRAM chip is soldered to a substrate for a downgraded memory module that has jumpers set for H2, such as jumper 88 connected to power to drive A13 high to the DRAM chip, or jumpers B, D of FIG. 4. Other jumpers are left open.

When the upper S/2 words fail, step 312, but the lower S/2 words pass, step 322, then the lower half H1 is defect free. The defect is isolated in the upper half. The DRAM chip is marked as size S/2, half H1 to indicate that the lower half H1 is good, step 324. This DRAM chip is soldered to a substrate for a downgraded memory module that has jumpers set for H1, such as jumper 88 (FIG. 3) connected to ground to drive A13 low to the DRAM chip, or jumpers C, D (FIG. 4). Other jumpers are left open.

When both upper and lower halves fail, steps 312, 322, there still may be S/2 good words on the DRAM chip in two quadrants of S/4 words. In FIG. 5B, quadrant checking is performed.

When the first S/4 words pass, step 330, quadrant Q1 is good. When the third S/4 words also pass, step 332, quadrant Q3 is also good. The DRAM chip is marked as downgraded size S/2, quadrants Q1Q3 good, step 334. The Q1Q3 DRAM chips are soldered to a substrate for a downgraded memory module that has jumpers set for the Q1Q3 configuration, step 336. The jumper settings (A, F) for Q1Q3 are shown in Table 1.

When the third S/4 words fail, step 332, but the fourth S/4 words pass, step 340, quadrant Q4 is good along with quadrant Q1. The DRAM chip is marked as downgraded size S/2, quadrants Q1Q4 good, step 344. The Q1Q4 DRAM chips are soldered to a substrate for a downgraded memory module that has jumpers set for the Q1Q4 configuration, step 346. The jumper settings for Q1Q4 are A, D as shown in Table 1.

When the first quadrant fails, step 330, but the second S/4 words pass, step 348, Q2 is good but Q1 is bad. When the third S/4 words pass, step 350, quadrants Q2, Q3 are good. The DRAM chip is marked as downgraded size S/2, quadrants Q2Q3 good, step 354. The Q2Q3 DRAM chips are soldered to a substrate for a downgraded memory module that has jumpers set for the Q2Q3 configuration, step 356. The jumper settings (D, G) for Q2Q3 are shown in Table 1.

When the third S/4 words fail, step 350, but the fourth quadrant passes, step 360, quadrants Q2, Q4 are good. The DRAM chip is marked as downgraded size S/2, quadrants Q2Q4 good, step 364. The Q2Q4 DRAM chips are soldered to a substrate for a downgraded memory module that has jumpers set for the Q2Q4 configuration, step 366. The jumper settings (A, E) for Q2Q4 are shown in Table 1.

During testing of the assembled memory modules, the configuration of the memory module may be programmed into SPD-EEPROM 130. The configuration is the downgraded, or half-depth S/2 configuration when downgrading occurs, or the full-depth configuration when all S words pass. SPD-EEPROM 130 could also be pre-programmed before soldering onto the substrate board.

When the second S/4 words failed in step 348, both quadrants Q1 and Q2 are bad. The only possible combination of two good quadrants is Q3Q4, which is the same as half H2. However, half H2 was already tested in step 312. Thus there is no possible combination of two good quadrants. The DRAM chip is sorted and binned as a bad DRAM chip, step 370. This DRAM chip can be discarded as being impossible to downgrade to size S/2. Further testing could be done to test for downgrading to size S/4 by testing eighths of the memory size, but this may not be economical.

Figure 6A:
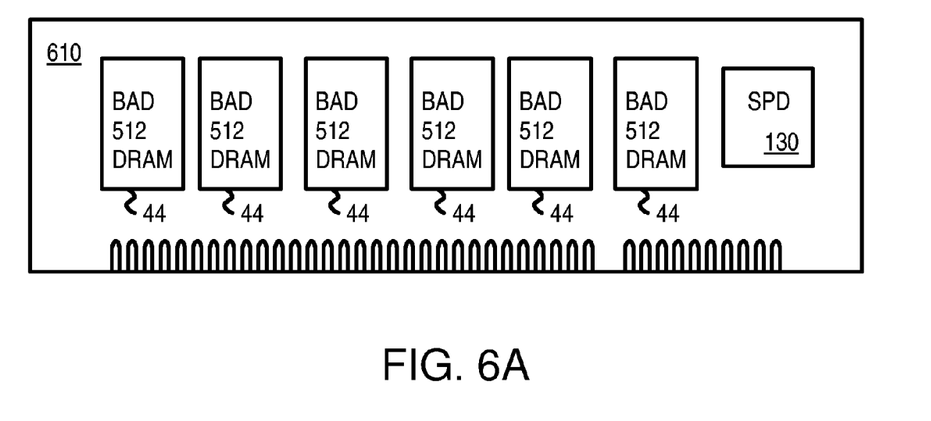
FIGS. 6A-B show memory modules with downgraded DRAM chips.
Figure 6B:
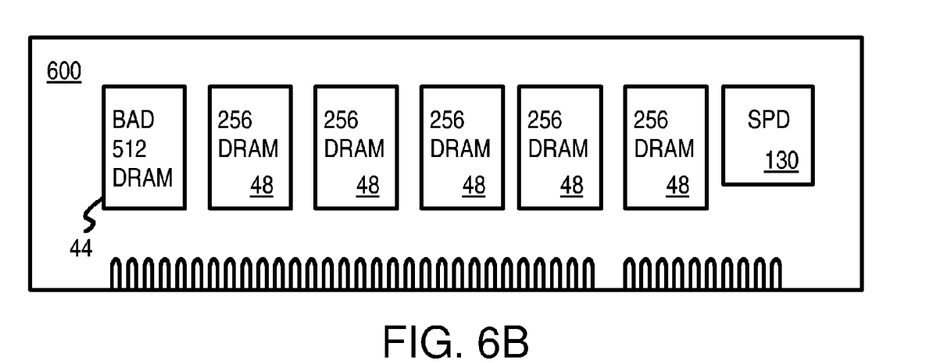

FIGS. 6A-B show memory modules with downgraded DRAM chips. In FIG. 6A, downgraded DRAM chips 44 are soldered to the substrate of memory module 610 along with SPD-EEPROM 130. Since downgraded DRAM chips 44 have half the depth of good DRAM chips, the depth of memory module 610 is half.

For example, if downgraded DRAM chips 44 are downgraded from 64Mx8 to 32Mx8, then memory module 610 can be downgraded from 64Mx64 to 32Mx64 when memory module 610 has eight downgraded DRAM chips 44 and a 64-bit data bus.

In this embodiment, all DRAM chips soldered to the substrate of memory module 610 are downgraded DRAM chips 44. The A12 and A13 inputs to all 8 downgraded DRAM chips 44 can be driven through the same set of jumpers. Trace layout is fairly simple since the address inputs to all DRAM chips are the same.

All downgraded DRAM chips 44 on a memory-module substrate have the same quadrants that are good. For example, when jumpers A, F are set, all 8 downgraded DRAM chips 44 are Q1Q3 chips. Other downgraded chips, such as Q2Q4, are not mixed on the same memory module. Each memory module contains the same type of downgraded DRAM chips 44.

In FIG. 6B, only one of the DRAM chips is a downgraded DRAM chip. Other DRAM chips are good DRAM chips. The downgraded size of downgraded DRAM chip 44 matches the full size of good DRAM chips 48. For example, downgraded DRAM chip 44 may have been downgraded from 512 Mbit to 256 Mbit. Good DRAM chips 48 are also 256 Mbit, and have the same depth and data width as downgraded DRAM chip 44.

Jumpers only alter the inputs to downgraded DRAM chip 44. Somewhat different trace wiring may be needed for good DRAM chips 48 than for downgraded DRAM chip 44. Mixed-size memory module 600 is useful when few downgraded DRAM chips 44 are available, such as for small factories or very high yields of DRAM chips.

Figure 7:
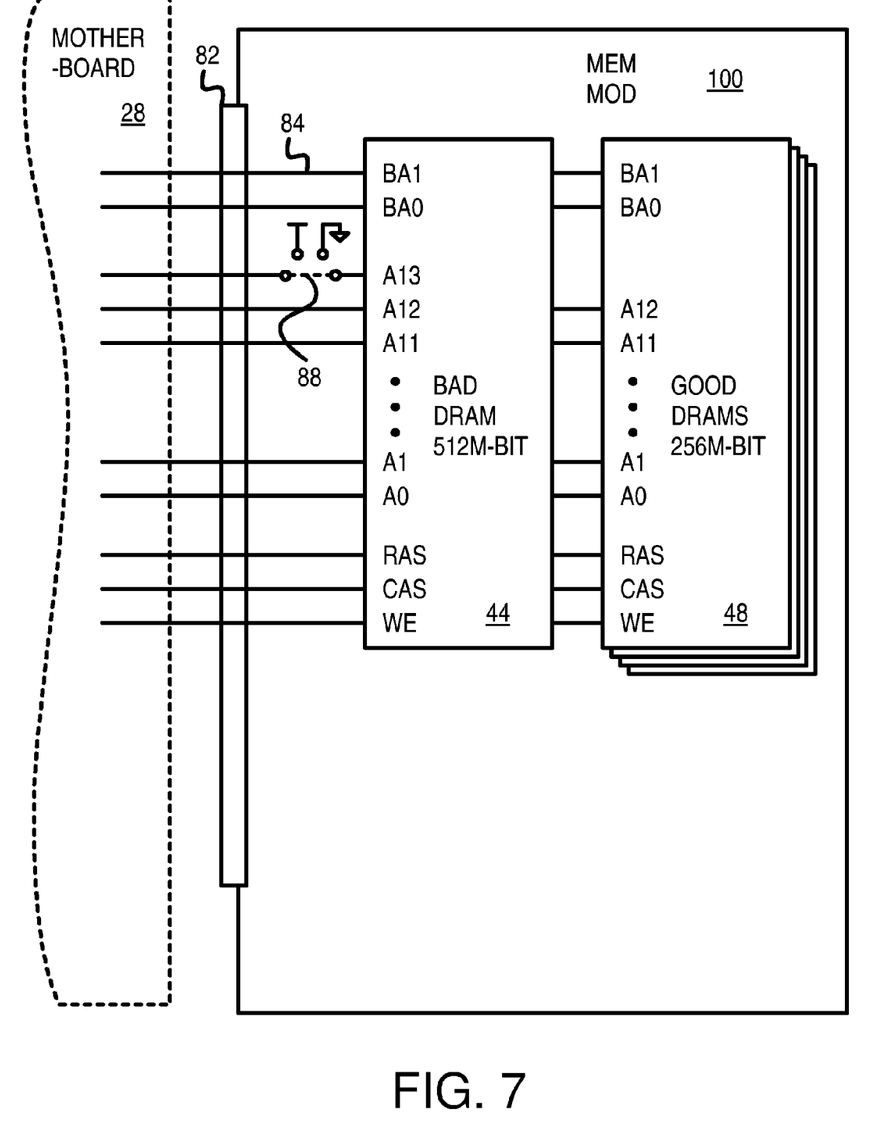
FIG. 7 shows trace wiring for a mixed downgraded memory module.

FIG. 7 shows trace wiring for a mixed downgraded memory module. Memory module substrate 100 has soldered to it both downgraded DRAM chip 44 and good DRAM chips 48 that have the same final size, depth, and data width. Signal traces 84 connect DRAM inputs to connector 82 to motherboard 28. Jumper 88 is used to disconnect A13 from connector 82 to downgraded DRAM chip 44 and drive the A13 input to downgraded DRAM chip 44 to power when upper half H2 is good, or to ground when lower half H1 is good on downgraded DRAM chip 44.

Since good DRAM chips 48 have half the original size of downgraded DRAM chip 44, they do not have the uppermost address input A13. Other address and control signals can be connected to both downgraded DRAM chip 44 and to good DRAM chips 48.

Figure 8:
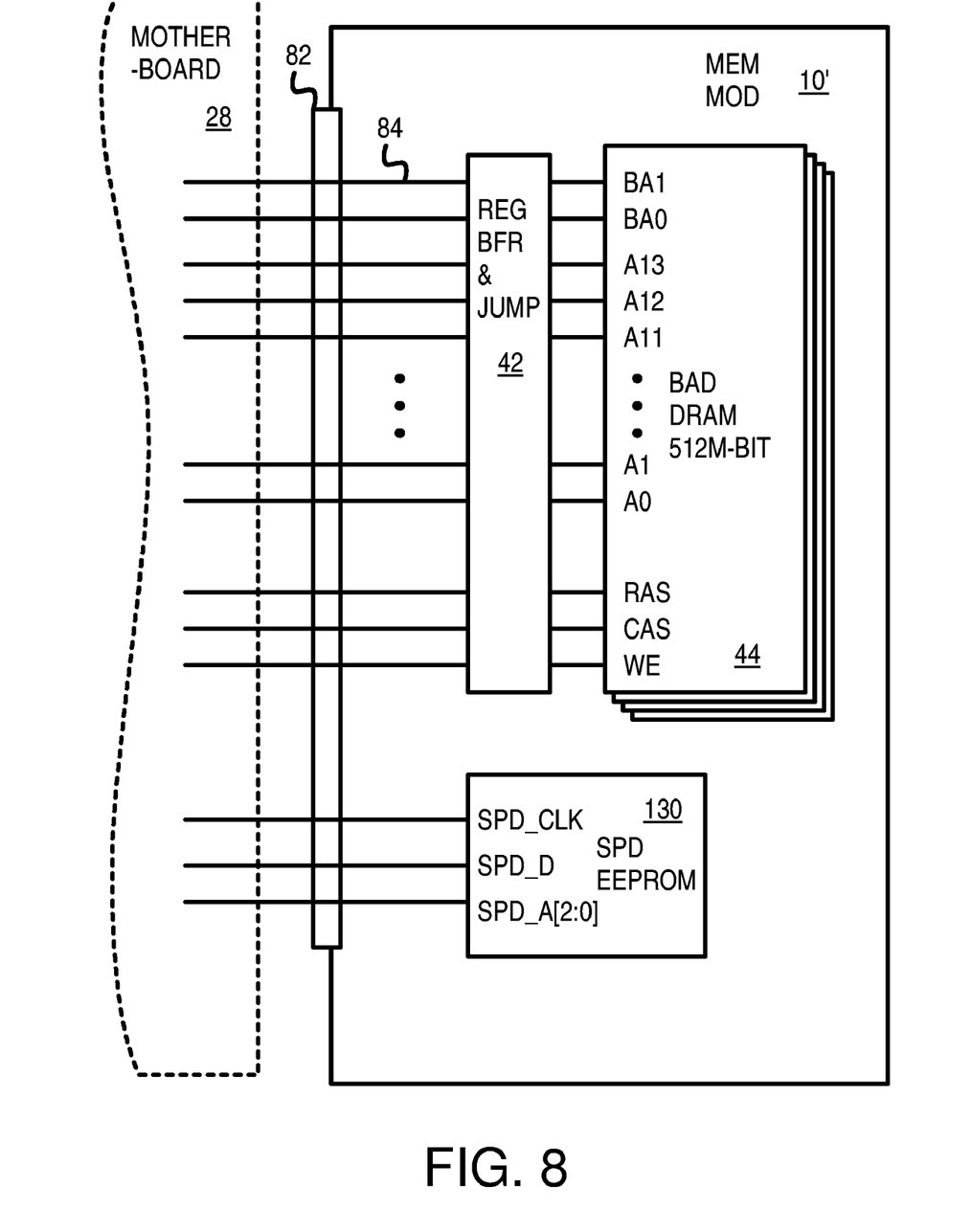
FIG. 8 shows a buffered downgraded memory module with jumpers integrated with the buffer chip.

FIG. 8 shows a buffered downgraded memory module with jumpers integrated with the buffer chip. Some memory modules may include one or more buffer chips. Buffer chip 42 can have non-clocked inverters or drivers to buffer signals, or transparent latches or flip-flops that clock signals, or various combinations. Some signals may be buffered by buffer chip 42 while other signals are not buffered or bypass buffer chip 42.

While external jumpers such as zero-ohm resistors may be used, these jumper functions may be integrated into buffer chip 42. Logic gates inside buffer chip 42 may drive the A13 and A12 inputs to downgraded DRAM chips 44 with power, ground, inverse, and pass through signals as shown in FIG. 4 and described in Table 1. These logic gates may be programmable for the different configurations, and be controlled by external pins to buffer chip 42, or by an internal register in buffer chip 42 that can be programmed. SPD-EEPROM 130 could also control the configuration of jumper logic in buffer chip 42, either directly or indirectly by host-executed software at initialization.

Alternate Embodiments

Several other embodiments are contemplated by the inventors. For example, while A13 has been described as the MSB, other sizes of DRAM may have other pins that are the physical MSB. The physical MSB is an address pin that is present on the full-size DRAM but is absent from (or not used by) the half-size DRAM. A13 is present on a 64M×8 DRAM, but is not present (or is a no-connect or is otherwise not used to carry an address) on a 32M×8 DRAM. Thus A13 is the physical MSB for 64M×8. A 1 Gbit DRAM organized as 128M×8 has a third bank address BA2 that is not present on the 64M×8 (512 Mbit) DRAM. Thus BA2 is the physical MSB for the 128M×8 DRAM.

A DRAM chip with a ×4 data width requires one more column address bit than a ×8 data width, and 2 more column address bits than a ×16. Bank addresses BA0, BA1 are not multiplexed. The number of multiplexed address bits depends on the depth and data width. For example, a 64M×8 DRAM chip has 64M addressable words, or 226, and requires a total of 26 address bits. When the address pins are BA1:0 and A13:0, then A13 to A0 can carry 14 row addresses, BA1:0 carries 2 more bank (or row) addresses, for a total of 16 address bits. Another 10 address bits are needed, so address lines A9 to A0 also carry column addresses. Address lines A13 to A10 carry only row addresses and thus are considered "non-multiplexed" for purposes of this application, even though they may be called multiplexed address pins on DRAM manufacturer's data sheets. Any column address applied to non-multiplexed pins A13 to A10 is ignored and not used by the DRAM chip for addressing.

The physical MSB should be a non-multiplexed address bit. A multiplexed address bit carries both a row and a column address, but at different times. When RAS is driven low, the multiplexed pins carry row address bits, then when CAS is driven low the multiplexed pins carry column addresses. Some DRAM chips have an output enable pin that functions as a CAS signal, but has transparent latches that allow column-address changes to flow through.

There are usually more row address bits than column address bits. The physical MSB should be an address pin that carries only a row address and not a column address. Conversely, if there are more column address bits than row address bits, the physical MSB should be an address pin that carries only a column address and not a row address. The assignment of column and row address bits varies with the depth and data width. The physical MSB does not have to be the logical MSB from the motherboard. The logical MSB may be routed to a different address pin by the motherboard or other logic. Thus the order of address bits to the physical DRAM chips may differ from the address-bit order from the host processor or motherboard.

When quadrants or smaller divisions are used, the second address bit used, such as A12 in the examples, does not have to be the second MSB. Instead, the second address bit may be any non-multiplexed bit that carries a row and not a column address, such as A11, BA0, BA1, etc. A bank address bit could also be used.

While quadrants have been described, smaller divisions of the memory could be tested and combined for downgrading. While a half-size downgrade has been described, higher reduction ratios could be used, such as a downgrade from S words to S/4 words, or from S words to S/8 words. The quadrants or divisions do not have to match physical divisions inside the DRAM chips, but can be logical divisions.

Jumpers could be breaks in circuit-board traces that can be bridged by a zero-ohm resistor or wire, or could be mechanical switches, logic gates, programmable logic such as programmable-logic arrays (PLA's), field-programmable gate arrays (FPGA's), Application-Specific Integrated Circuit (ASIC), or various combinations. Substrate circuit boards could be hardwired with traces for one of the six configurations, and separate circuit board layouts used for each possible downgraded configuration, or for a set of configurations.

Some configurations may not be implemented, such as Q2Q3. Eliminating Q2Q3 can eliminate inverter 38. Alternately, inverter 38 could be attached only for Q2Q3 configurations and not for other configurations. Rather than inverting A12 to generate A13, A13 could be inverted to generate A12. The inverter may be undesirable for some unbuffered memory modules due to the added delay from the inverter.

Although marking DRAM chips has been described, such as printing a part number or size on a package, marking is not necessary. DRAM chips can be sorted by the tester or handling equipment controlled by the test results into separate bins. Each bin contains chips of the same test result, such as Q2Q3 good chips. The separately binned chips may be directly soldered to memory module substrates without any chip marking by carefully keeping track of the separate bins.

SPD-EEPROM 130 could be integrated into an Advanced Memory Buffer (AMB) or another buffer chip. Downgrading logic could then be integrated with the AMB or buffer chip. SPD-EEPROM 130 may not be present on some types of memory modules. The invention could be applied to unbuffered memory modules, buffered memory modules, Fully-Buffered Dual-Inline Memory Module (FB-DIMM) memory modules, and other kinds of memory modules, including memory modules using future standards.

While DRAM has been described, other kinds of memory could be substituted, such as SRAM, non-volatile memory, or other kinds of memory. The invention may be combined with chip-level redundancy and repair that the DRAM manufacturer performs. Built-in-self-test (BIST) could be used for testing.

Different control signals may be used. Traces may be formed from metal traces on surfaces of the memory module, or on interior traces on interior layers of a multi-layer PCB. Vias, wire jumpers, or other connections may form part of the electrical path. Resistors, capacitors, or more complex filters and other components could be added. For example, power-to-ground bypass capacitors could be added to the memory module.

Muxes and switches could be added to allow for loop-back testing as well as standard operation. Future memory module standards and extensions of the memory module standard could benefit from the invention.

In FIGS. 5A-B, all testing may be performed in step 304, and the test results used to determine which halves or quadrants are good, rather than have separate or repeated tests for each possible combination of quadrants. Steps 310, 312, 322, 330, 332, 340 348, 350, 360 can be a multi-target jump or conditional statement in a test program rather than separate steps as shown for illustration.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A downgraded memory module comprising:
   a substrate having wiring traces formed thereon for conducting signals;
   contact pads along a lower edge of the substrate, the contact pads for mating with a memory module socket on a motherboard;
   memory chips mounted to the substrate, the memory chips having address, data, and control inputs that are directly connected to the contact pads or are buffered from the contact pads by a buffer chip;
   wherein the memory chips have a depth of S/2 words that are accessible using the address inputs, and a width of W bits per word, wherein S and W are whole numbers and S is at least $2^{20}$;
   wherein at least one of the memory chips is a downgraded memory chip that has a native depth of S words that are all accessible through pins of the downgraded memory chip when not soldered to the substrate, but only S/2 words are accessible through the contact pads; and
   first jumper means, mounted on the substrate, for connecting a dividing address pin of the downgraded memory chip to a fixed high voltage supply when the S/2 words are an upper half of the S words in the downgraded memory chip for an upper-half configuration, and for connecting the dividing address pin of the downgraded memory chip to a fixed low voltage supply when the S/2 words are a lower half of the S words in the downgraded memory chip for a lower-half configuration,
   whereby only half of the native depth of S words of the downgraded memory chip are accessible through the contact pads of the downgraded memory module.

2. The downgraded memory module of claim 1 wherein all of the memory chips on the substrate are downgraded memory chips.

3. The downgraded memory module of claim 1 wherein at least one of the S words in the downgraded memory chip is faulty,
   whereby faulty memory in the downgraded memory chip is externally disabled by the first jumper means on the substrate.

4. The downgraded memory module of claim 1 wherein the memory chips are dynamic-random-access memory (DRAM) having multiplexed address pins that receive a row address in response to a RAS input, and receive a column address in response to a CAS input;
   wherein the memory chips also have non-multiplexed address pins that receive a row address in response to the RAS input, but do not receive a column address in response to the CAS input;
   wherein the dividing address pin is a non-multiplexed address pin that carries only a row address and not a column address to good memory chips having a native depth of S words, whereby the dividing address pin is a non-multiplexed address pin.

5. The downgraded memory module of claim 4 wherein the dividing address pin is a physical most-significant-bit (MSB) address pin that is present on good memory chips having a native depth of S words and width W, but is not used to carry an address bit on a good memory chip having a native depth of S/2 words and width W.

6. The downgraded memory module of claim 5 further comprising:
   a serial-presence-detect electrically-erasable programmable read-only memory (SPD-EEPROM) mounted to the substrate; and a configuration programmed into the SPD-EEPROM, the configuration indicating a depth of S/2 for the downgraded memory module, whereby a downgraded size is programmed into the SPD-EEPROM on the substrate.

7. The downgraded memory module of claim 1 further comprising:

second jumper means, mounted on the substrate, for connecting a second dividing address pin of the downgraded memory chip to the fixed high voltage supply for a Q2Q4 configuration, and for connecting the second dividing address pin of the downgraded memory chip to the fixed low voltage supply for a Q1Q3 configuration.

8. The downgraded memory module of claim 7 wherein the first jumper means is further for connecting a toggling address input from the contact pads to the dividing address pin for the Q2Q4 configuration and for the Q1Q3 configuration;

wherein the second jumper means is further for connecting the toggling address input from the contact pads to the second dividing address pin of the downgraded memory chip for the upper-half configuration and for the lower-half configuration.

9. The downgraded memory module of claim 8 wherein the Q2Q4 configuration enables access to a second quadrant and to a fourth quadrant and disables access to a first quadrant and to a third quadrant that are defined by values of the dividing address pin and the second dividing address pin;

wherein the Q1Q3 configuration enables access to the first quadrant and to the third quadrant and disables access to the second quadrant and to the fourth quadrant that are defined by values of the dividing address pin and the second dividing address pin.

10. The downgraded memory module of claim 7 wherein the first jumper means is further for connecting a toggling address input from the contact pads to the dividing address pin for a Q1Q4 configuration;

wherein the second jumper means is further for connecting the toggling address input from the contact pads to the second dividing address pin of the downgraded memory chip for the Q1Q4 configuration;

wherein the Q1Q4 configuration enables access to a first and to a fourth quadrant and disables access to a second and to a third quadrant that are defined by values of the dividing address pin and the second dividing address pin.

11. The downgraded memory module of claim 7 wherein the first jumper means comprises zero-ohm resistors, jumper wires, patterned traces on a circuit board, logic gates, or programmable logic; and wherein the second jumper means comprises zero-ohm resistors, jumper wires, patterned traces on a circuit board, logic gates, or programmable logic.

12. A downgrading method for manufacturing memory modules comprising:

receiving partially-tested memory chips having a depth of S words, wherein the partially-tested memory chips are packaged dice that have not been fully tested to detect all defects;

fully testing the partially-tested memory chips by applying extensive test patterns to the partially-tested memory chips;

wherein the extensive test patterns test for possible defects that were not detected in the partially-tested memory chips;

for good memory chips that pass the extensive test patterns for all S words, sorting the good memory chips as good memory chips having a depth of S words, and soldering the good memory chips to full-size memory modules having a depth of S words;

for memory chips that pass the extensive test patterns for an upper S/2 words, but fail for a lower S/2 words, sorting the memory chips as downgraded upper-half memory chips having a depth of S/2 words, and soldering the downgraded upper-half memory chips to downgraded upper-half memory modules having a depth of S/2 words;

wherein the downgraded upper-half memory modules disable access to the lower S/2 words on the downgraded upper-half memory chips by driving a dividing address pin to a high state to disable access to the lower S/2 words; and for memory chips that pass the extensive test patterns for the lower S/2 words, but fail for the upper S/2 words, sorting the memory chips as downgraded lower-half memory chips having a depth of S/2 words, and soldering the downgraded lower-half memory chips to downgraded lower-half memory modules having a depth of S/2 words;

wherein the downgraded lower-half memory modules disable access to the upper S/2 words on the downgraded lower-half memory chips by driving the dividing address pin to a low state to disable access to the upper S/2 words, whereby downgraded memory chips that fail the extensive test patterns for half of the S words are soldered to downgraded memory modules having a depth of S/2 words that disable access to S/2 words by driving the dividing address pin to the downgraded memory chips.

13. The downgrading method of claim 12 further comprising:

using a same circuit-board substrate for the downgraded upper-half memory modules, the downgraded lower-half memory modules, connecting the dividing address pin to a high power supply for downgraded upper-half memory modules; and connecting the dividing address pin to ground for downgraded lower-half memory modules, whereby a same circuit board is used for the downgraded upper-half memory modules and for the downgraded lower-half memory modules.

14. The downgrading method of claim 12 further comprising:

programming a size of S into a serial-presence-detect-electrically-erasable programmable read-only memory (SPD-EEPROM) mounted to the full-size memory module;

programming a size of S/2 into the SPD-EEPROM mounted to the downgraded upper-half memory modules;

programming a size of S/2 into the SPD-EEPROM mounted to the downgraded lower-half memory modules, whereby a downgraded size is programmed into the SPD-EEPROM for downgraded memory modules.

15. The downgrading method of claim 12 further comprising:

for memory chips that pass the extensive test patterns for a first S/4 words and for a third S/4 words, but fail for other S/4 words, sorting the memory chips as downgraded Q1Q3 memory chips having a depth of S/2 words, and soldering the downgraded Q1Q3 memory chips to downgraded Q1Q3 memory modules having a depth of S/2 words;

wherein the downgraded Q1Q3 memory modules disable access to the other S/4 words on the downgraded Q1Q3 memory chips by driving a secondary dividing address pin to the low state and connecting the dividing address pin to a secondary dividing-address input to the memory module;

wherein the secondary dividing-address input to the full-size memory modules connect to the secondary dividing address pin of the good memory chips, whereby logical quadrants are tested for downgrading.

16. The downgrading method of claim 15 further comprising:

for memory chips that pass the extensive test patterns for a second S/4 words and for a fourth S/4 words, but fail for other S/4 words, sorting the memory chips as downgraded Q2Q4 memory chips having a depth of S/2 words, and soldering the downgraded Q2Q4 memory chips to downgraded Q2Q4 memory modules having a depth of S/2 words;

wherein the downgraded Q2Q4 memory modules disable access to the other S/4 words on the downgraded Q2Q4 memory chips by driving the secondary dividing address pin to the high state and connecting the dividing address pin to the secondary dividing-address input to the memory module, whereby logical quadrants are tested for downgrading.

17. The downgrading method of claim 16 further comprising:

for memory chips that pass the extensive test patterns for the first S/4 words and for the fourth S/4 words, but fail for other S/4 words, sorting the memory chips as downgraded Q1Q4 memory chips having a depth of S/2 words, and soldering the downgraded Q1Q4 memory chips to downgraded Q1Q4 memory modules having a depth of S/2 words;

wherein the downgraded Q1Q4 memory modules disable access to the other S/4 words on the downgraded Q1Q4 memory chips by connecting both the dividing address pin and the secondary dividing address pin to the secondary dividing-address input to the memory module.

18. The downgrading method of claim 17 further comprising:

discarding memory chips that fail more than two quadrants of S/4 words.

19. The downgrading method of claim 17 further comprising:

soldering zero-ohm resistors as jumpers on a circuit-board substrate to disable access to other S/4 words, the jumpers controlling connection to the dividing address pin and to the secondary dividing address pin of memory chips.

20. The downgrading method of claim 12 wherein the memory chips are dynamic-random-access memory (DRAM) having multiplexed address pins that receive a row address in response to a RAS input, and receive a column address in response to a CAS input;

wherein the memory chips also have non-multiplexed address pins that receive a row address in response to the RAS input, but do not receive a column address in response to the CAS input;

further comprising:

selecting as the dividing address pin a non-multiplexed address pin that carries only a row address and not a column address to the good memory chips of size S words, whereby the dividing address pin is selected as a non-multiplexed address pin.

21. The downgrading method of claim 12 further comprising:

selecting as the dividing address pin a physical most-significant-bit (MSB) address pin that is present on the good memory chips of size S words and width W, but is not used to carry an address bit on a memory chip having a size of S/2 words and width W.

22. The downgrading method of claim 12 wherein S is a whole number of at least $2^{22}$.

23. The downgrading method of claim 12 wherein sorting the memory chips as downgraded memory chips comprising marking a package of a downgraded memory chip with a marker;

wherein the marker indicates which one of the following groups the downgraded memory chip belongs to:

(1) downgraded upper-half memory chips;
(2) downgraded lower-half memory chips;
(3) downgraded Q1Q3 memory chips;
(4) downgraded Q2Q4 memory chips; and
(5) downgraded Q1Q4 memory chips.

* * * * *